(12) United States Patent
Dekate et al.

(10) Patent No.: US 7,579,883 B2
(45) Date of Patent: Aug. 25, 2009

(54) FREQUENCY DIVIDER

(75) Inventors: Prashant Dekate, Gratwein (AT); Dominicus Martinus Wilhelmus Leenaerts, Eindhoven (NL)

(73) Assignee: NXP B.V., Eindhoven (NL)

( * ) Notice: Subject to any disclaimer, the term of this patent is extended or adjusted under 35 U.S.C. 154(b) by 61 days.

(21) Appl. No.: 11/573,349

(22) PCT Filed: Jul. 27, 2005

(86) PCT No.: PCT/IB2005/052531

§ 371 (c)(1),
(2), (4) Date: Oct. 3, 2007

(87) PCT Pub. No.: WO2006/016310

PCT Pub. Date: Feb. 16, 2006

(65) Prior Publication Data

US 2008/0186062 A1     Aug. 7, 2008

(30) Foreign Application Priority Data

Aug. 6, 2004 (EP) ................... 04103795

(51) Int. Cl.
  *H03B 19/00* (2006.01)
(52) U.S. Cl. .................... 327/117
(58) Field of Classification Search ................. 327/117; 377/47
See application file for complete search history.

(56) References Cited

U.S. PATENT DOCUMENTS

| | | | | |
|---|---|---|---|---|
| 3,902,125 | A * | 8/1975 | Oliva, Jr. ................... | 377/108 |
| 3,943,379 | A * | 3/1976 | McGuffin ................... | 377/115 |
| 5,172,400 | A * | 12/1992 | Maemura ................... | 377/116 |
| 5,438,600 | A * | 8/1995 | Seki et al. ................... | 377/47 |
| 5,526,391 | A * | 6/1996 | Shankar et al. ............... | 377/47 |
| 5,552,732 | A * | 9/1996 | Huang ........................ | 327/116 |
| 6,009,139 | A | 12/1999 | Austin et al. | |
| 6,064,247 | A * | 5/2000 | Krakirian ................... | 327/295 |
| 7,197,104 | B1 * | 3/2007 | Cheung et al. ............... | 377/118 |

* cited by examiner

*Primary Examiner*—Jeffrey S Zweizig

(57) ABSTRACT

A frequency divider providing an odd integer division factor comprising a binary counter (10) providing an even integer division factor, which is the first even number smaller than the odd division factor, the binary counter having a clock input for receiving a periodical clock signal (Ck) having a frequency. The circuit further comprises an end of count circuit (20) coupled to the binary counter and generating an End Of Count signal (EOC) for a clock (Ck) period after every even integer number periods of the clock signal (Ck), the end of count signal (EOC) being inputted to an input (IN) of the counter (10). The circuit further includes an output generator (30) coupled to the binary counter and to the clock signal (Ck), the output generator (30) generating an output signal (OUT) having a frequency which is substantially equal with the frequency of the frequency signal (Ck) divided by the odd division factor.

13 Claims, 6 Drawing Sheets

FREQUENCY DIVIDER

Frequency dividers are widely spread digital devices, which are used for dividing a frequency of an input clock signal and for providing an output signal having the divided clock frequency. A ratio between the frequency of the output signal and the frequency of the input signal e.g. clock signal is called division factor. Generally, integer numbers represents division factors.

Frequency dividers are relatively simple state machines and they may be implemented in various ways. One possible way is using counters. In this case the design of a frequency divider reduces to the design of a specific counter. There are developed well-known techniques for counters design as described in e.g. Douglas Lewin, "Design of Logic Systems", Van Nostrand Reinhold (UK) Co. Ltd., 1985, Paragraph 6.3. Generally, a frequency divider having a division factor N is a state machine having N states and a widely used implementation is by means of flip-flops. The minimum number of flip-flops for implementing a counter having N states is the smallest integer number m for which the following relation holds: $N \leq 2^m$. For example, frequency dividers having division factors between 5 and 8 may be implemented using at least 3 flip-flops. At the outputs of the flip-flops we may find the divided frequency. When larger division factors are necessary it is preferable to cascade several counters, each counter providing a division factor. Let us consider for example that a division by 256 is necessary. We may write that 256=16*16 and the division could be implemented by cascading a first and a second counter, each having a division factor 16. The first counter receives the clock signal and after a division by 16 it generates an End Of Count (EOC) signal, which is inputted to the second counter in its clock input. The EOC signal indicates that the first counter has finished the division by 16. The circuit implementing the EOC signal is generally a combinatorial logic circuit whose complexity depends on the particular implementation of the counter. Of course it is wishful to implement it in an as simple as possible circuit.

In communication circuits, frequency dividers are used in e.g. prescalers for dividing a frequency of a local oscillator. Preferable, the duty cycle of the divided signal should be 50%. A periodical binary signal having a period T consists of a succession of a HIGH state followed by a LOW state in each period of the signal. Assuming that during a period the signal is for a time period $t_{up}$ in HIGH state, then the duty cycle is $t_{up}/T$ and it is expressed in percentages.

In general, the output signal of a frequency divider having an odd division factor has not a duty cycle of 50%.

However, U.S. Pat. No. 4,348,640 depicts a divide by 3 clock divider whose output signal has 50% duty cycle. The frequency divider is designed as a state machine comprises JK flip-flops. A divide by 1 and ½ circuit clocks a divide by 2 flip-flop resulting in a symmetrical divide by three circuit. The divide by 1 and ½ circuit includes a pair of JK flip-flops and logic gates, which receive clock pulses of frequency F and generate a plurality of staggered signal streams with non-symmetrical pulses of frequency F/3 and a duty cycle of substantially 33%. The input clock pulses are gated against two of theses streams to provide an output pulse during the first half of the duty portion of a cycle of one of the streams, and another output pulse during the second half of the duty portion of a cycle of the other stream, to provide an output frequency of 2*F/3, which then clocks the divide by 2 flip-flop. It is observed that there are used 3 flip-flops for implementing a state machine having 3 states i.e. the divide by three circuit. Furthermore, the combinatorial portion of the circuit is relatively complicated and there is no indication for designing other frequency dividers having odd division factors.

It is therefore an object of the invention to provide an improved frequency divider.

This object is achieved in a frequency divider providing an odd integer division factor comprising:
   a binary counter providing an even integer division factor, which is the odd division factor minus one, the binary counter having a clock input for receiving a periodical clock signal having a frequency,
   an end of count circuit coupled to the binary counter and generating,
   an End Of Count signal for a clock period after every even said integer number periods of the clock signal, the end of count signal being inputted to an input of the counter, and
   an output generator coupled to the binary counter and to the clock signal, the output generator generating an output signal having a frequency that is substantially equal to the frequency of the frequency signal divided by the odd division factor.

Hence, for a divide by 3 circuit only 1 flip-flop is necessary i.e. one for a divide by 2 counter. The end of count circuit generates an output signal for a clock period and, therefore it may be implemented either with a flip-flop or using combinatorial circuits as e.g. multiplexers. When the end of count circuit is implemented with flip-flops, it results that the total number of flip-flops, which are necessary for a divide by 3 circuit is 2 i.e. still smaller than the number of flip-flops used in the prior-art circuit. Furthermore, the above design method can be extended for frequency dividers having any odd division factor.

Preferably the end of count circuit comprises an AND gate receiving most significant two bits generated by the binary counter and providing a signal for changing a state of a flip-flop for a clock period. Any binary counter implemented with flip-flops comprises a string of flip-flops. At an output of a flip-flop is obtained a signal whose frequency is the divided clock frequency by the division factor. This flip-flop is called the most significant flip-flop. The output of the most significant flip-flop and an output of a previous flip-flop in the string, which is coupled to the most significant flip-flop are called most significant outputs throughout this application.

In an embodiment of the invention the binary counter is a Gray counter. A Grey counter has its states coded using Grey code, which in turn has the property that only one bit is change when passing from one state to the next one. This property in useful in design of relatively high frequency dividers when may appear glitches when the counter passes from one state to the next one.

Preferably the binary counter comprises D flip-flops, because in certain technologies as CMOS they are relatively easy to be implemented and occupy a relatively small area of integrated circuit.

The above and other features and advantages of the invention will be apparent from the following description of exemplary embodiments of the invention with reference to the accompanying drawings, in which:

FIG. 6 depicts an implementation of a divide by 7 circuit, according to an embodiment of the invention, and.

Figure 1:
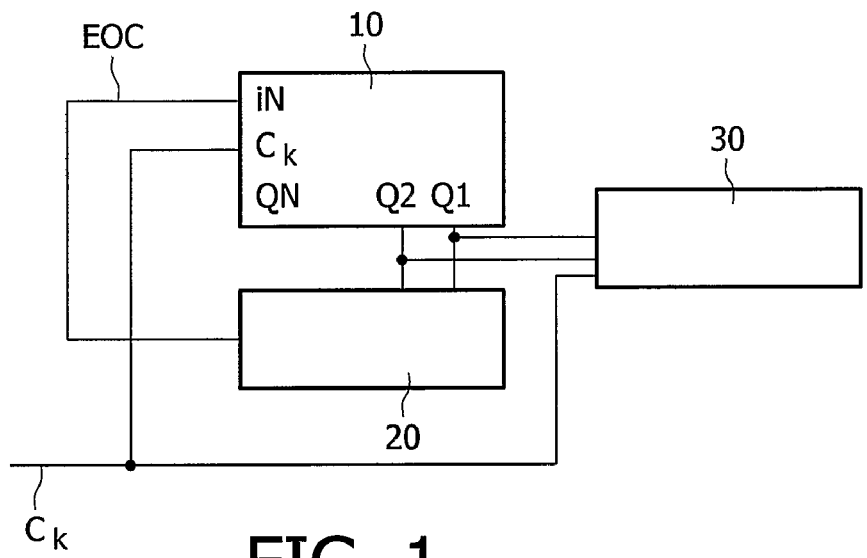
FIG. 1 depicts a block diagram of a frequency divider, according to an embodiment of the invention.

FIG. 1 depicts a block diagram of a frequency divider, according to an embodiment of the invention. The frequency divider providing an integer odd division factor comprises a binary counter 10 providing an even integer division factor. This division factor is the odd division factor minus one. The binary counter has a clock input for receiving a periodical clock signal Ck having a frequency. The frequency divider further comprises an end of count circuit 20 coupled to the binary counter and generating an End Of Count signal EOC for a clock Ck period after every even integer number periods of the clock signal Ck. The end of count signal EOC is inputted to an input IN of the counter 10. The frequency divider also includes an output generator 30 coupled to the binary counter and to the clock signal Ck, the output generator 30 generating an output signal OUT having a frequency which is substantially equal with the frequency of the frequency signal Ck divided by the odd division factor.

Hence, for a divide by 3 circuit only 1 flip-flop is necessary i.e. one for a divide by 2 counter. The end of count circuit generates an output signal for a clock period and, therefore it may be implemented either with a flip-flop or using combinatorial circuits as e.g. multiplexers. When the end of count circuit is implemented with flip-flops, it results that the total number of flip-flops, which are necessary for a divide by 3 circuit is 2 i.e. still smaller than the number of flip-flops used in the prior-art circuit. Furthermore, the above design method can be extended for frequency dividers having any odd division factor as it will be apparent later on in this application.

Figure 2:
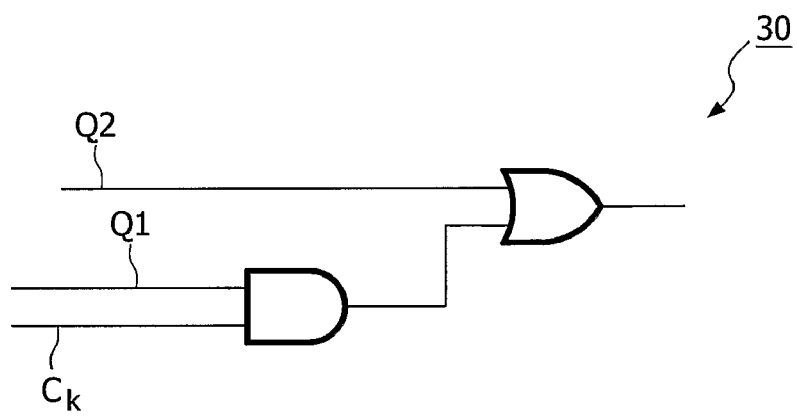
FIG. 2 depicts an embodiment of an output generator, according to the invention.

FIG. 2 depicts an embodiment of an output generator 30, according to the invention. It comprises only combinatorial circuits e.g. a 2 input AND gate 31 coupled to a 2 input OR gate 32. The AND gate 31 receives the clock signal Ck and a most significant output signal Q1 generated by the counter. The OR gate receives a signal generated at a previous counter output Q2 of the counter.

Figure 3:
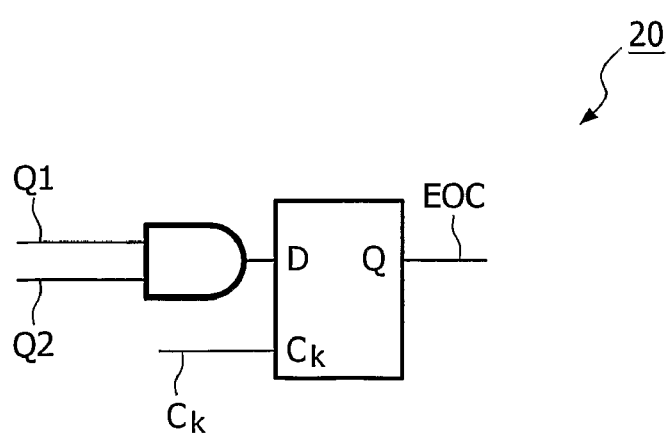
FIG. 3 depicts an embodiment of an end of count circuit, according to the invention.

FIG. 3 depicts an embodiment of an end of count circuit, according to the invention. Preferably the end of count circuit 20 comprises an AND gate 21 receiving most significant two bits Q1, Q2 generated by the binary counter 10 and providing a signal for changing a state of a flip-flop for a clock period. Any binary counter implemented with flip-flops comprises a string of flip-flops. At an output of a flip-flop is obtained a signal whose frequency is the divided clock frequency by the division factor. This flip-flop is called the most significant flip-flop. The output of the most significant flip-flop and an output of a previous flip-flop in the string, which is coupled to the most significant flip-flop are called most significant outputs throughout this application.

It should be observed that, in general the counter may be also be implemented using other type of clock controlled memory elements as ROMs, RAMs, multiplexers and using different technologies as MOS, bipolar, BiCMOS etc.

Figure 4:
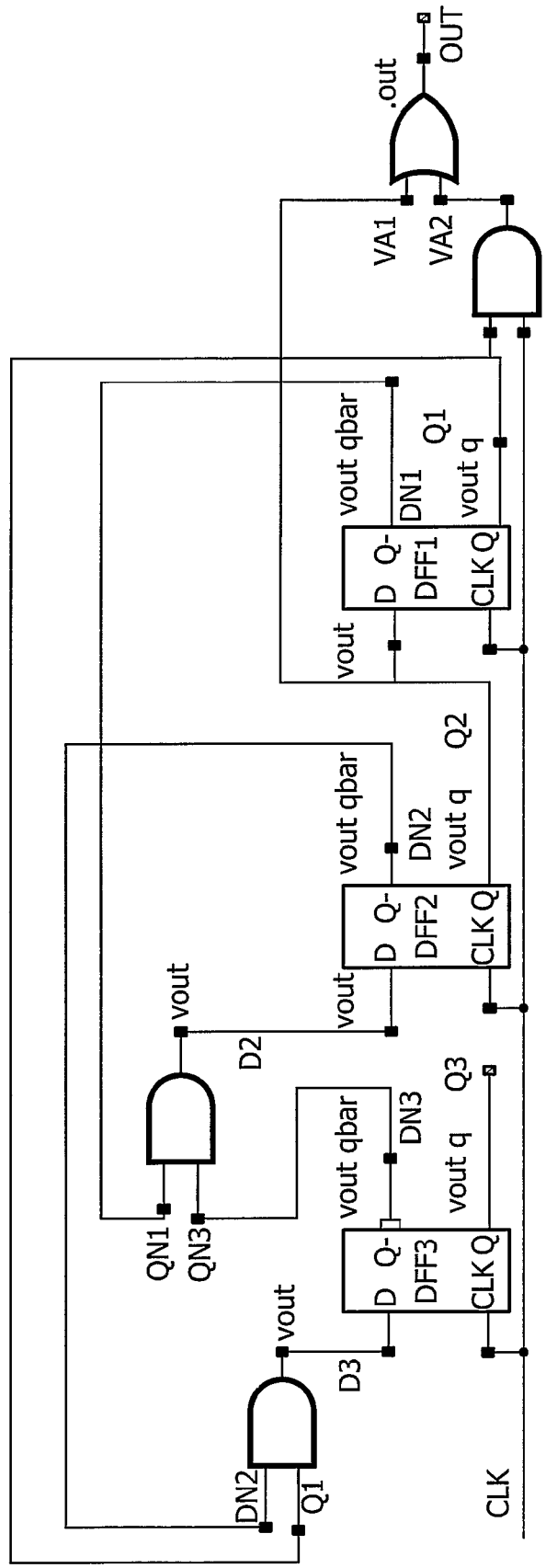
FIG. 4 depicts an implementation of a divide by 5 circuit, according to an embodiment of the invention.

FIG. 4 depicts an implementation of a divide by 5 circuit, according to an embodiment of the invention. The circuit comprises a Grey code counter comprising the most significant flip-flop DFF1 and the flip-flop DFF2, implementing a divide by 4 counter. The outputs of the flip-flops are fed-back into the end of count circuit implemented with an AND gate coupled to the flip-flop DFF3. The end of the count circuit generates the EOC signal, which is inputted into the counter.

Figure 5A:
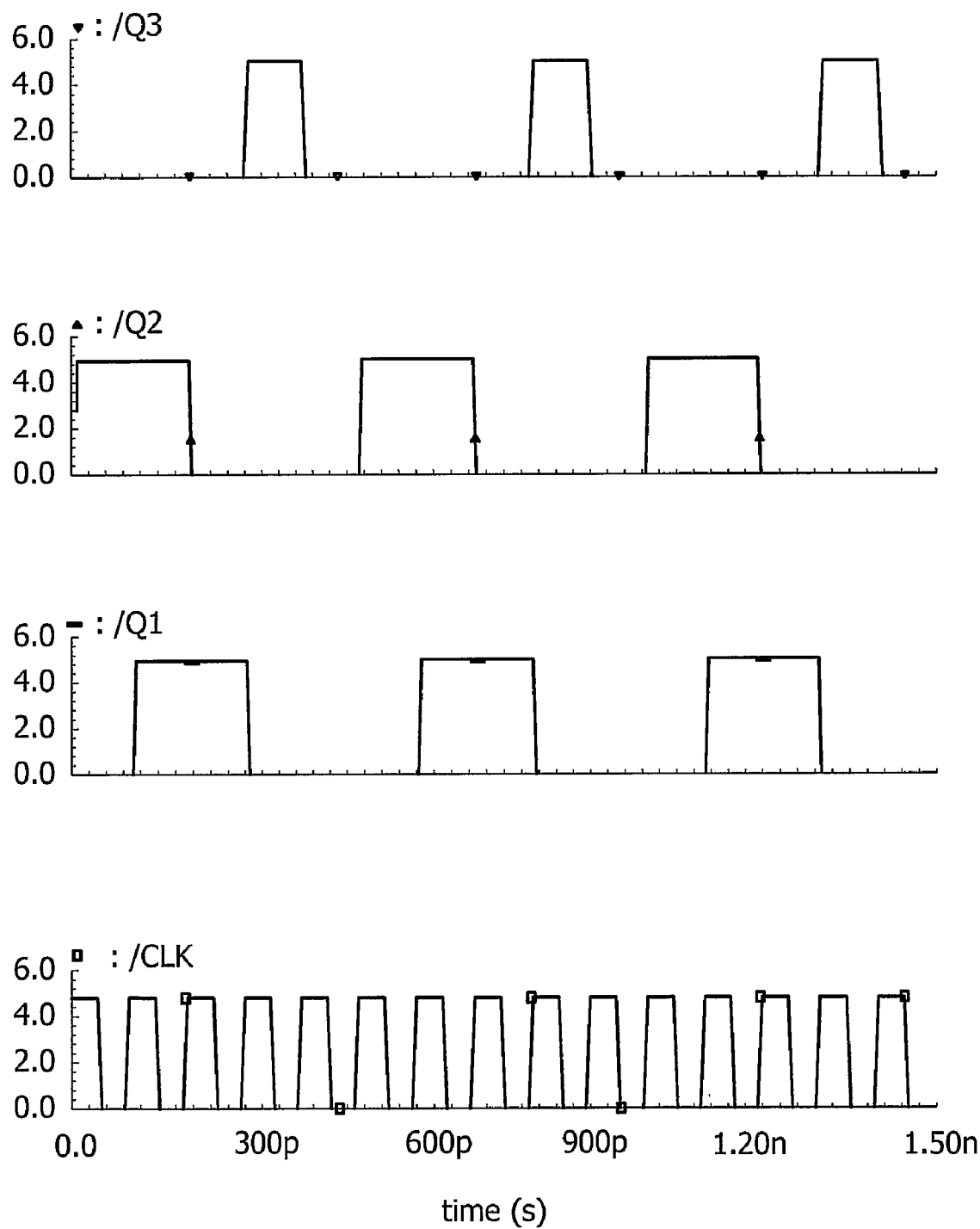
FIGS. 5a and 5b depict the waveforms of the signals of a divide by 5 circuit, according to an embodiment of the invention.
Figure 5B:
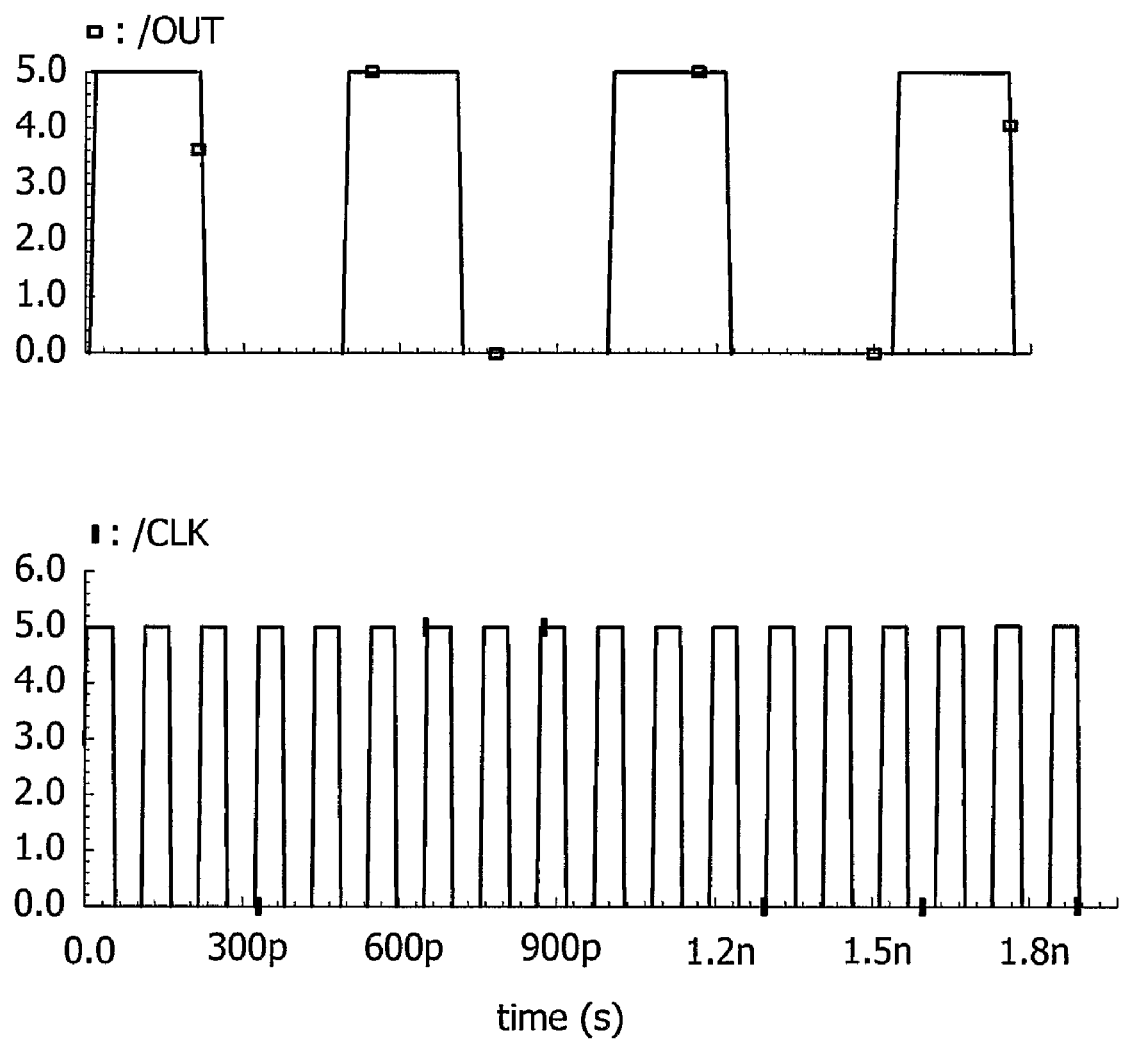

The output generator comprises an AND gate coupled to an OR gate as shown in FIG. 3. The waveforms of the signals of the divide by 5 circuit are shown in FIGS. 5a and 5b.

It is easy to see that the output OUT signal has 50% duty cycle.

Figure 6:
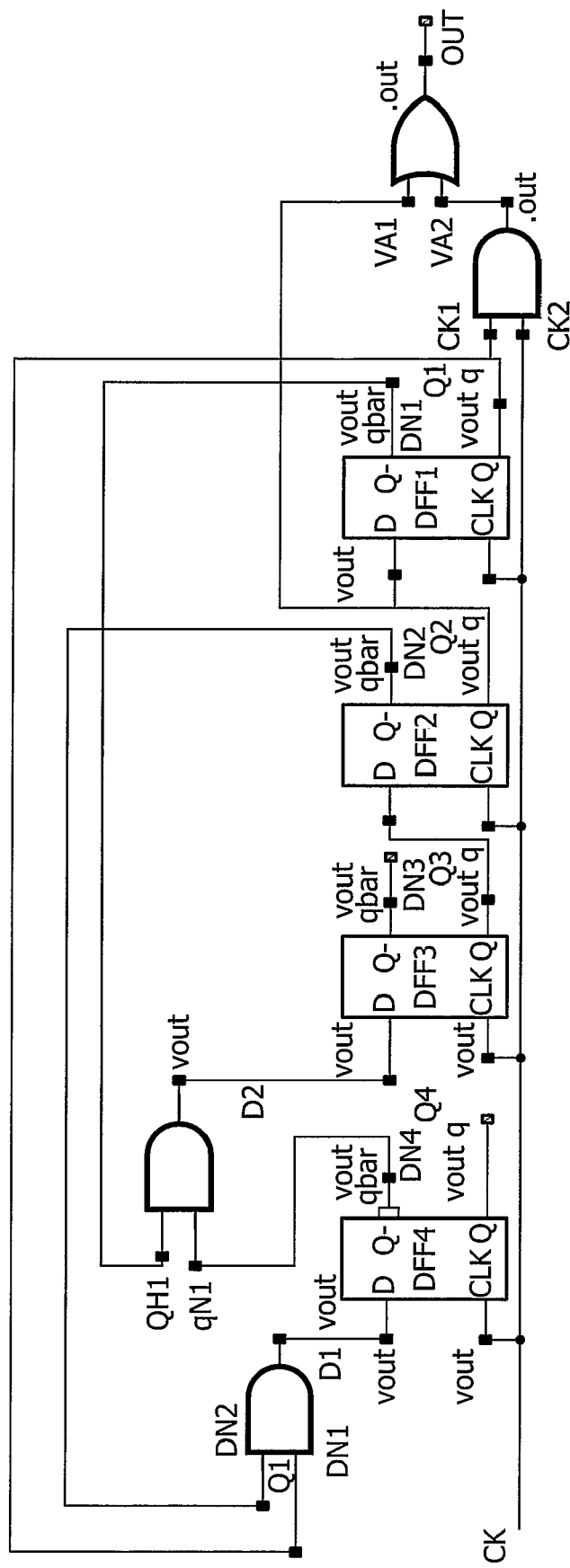
Figure 7:
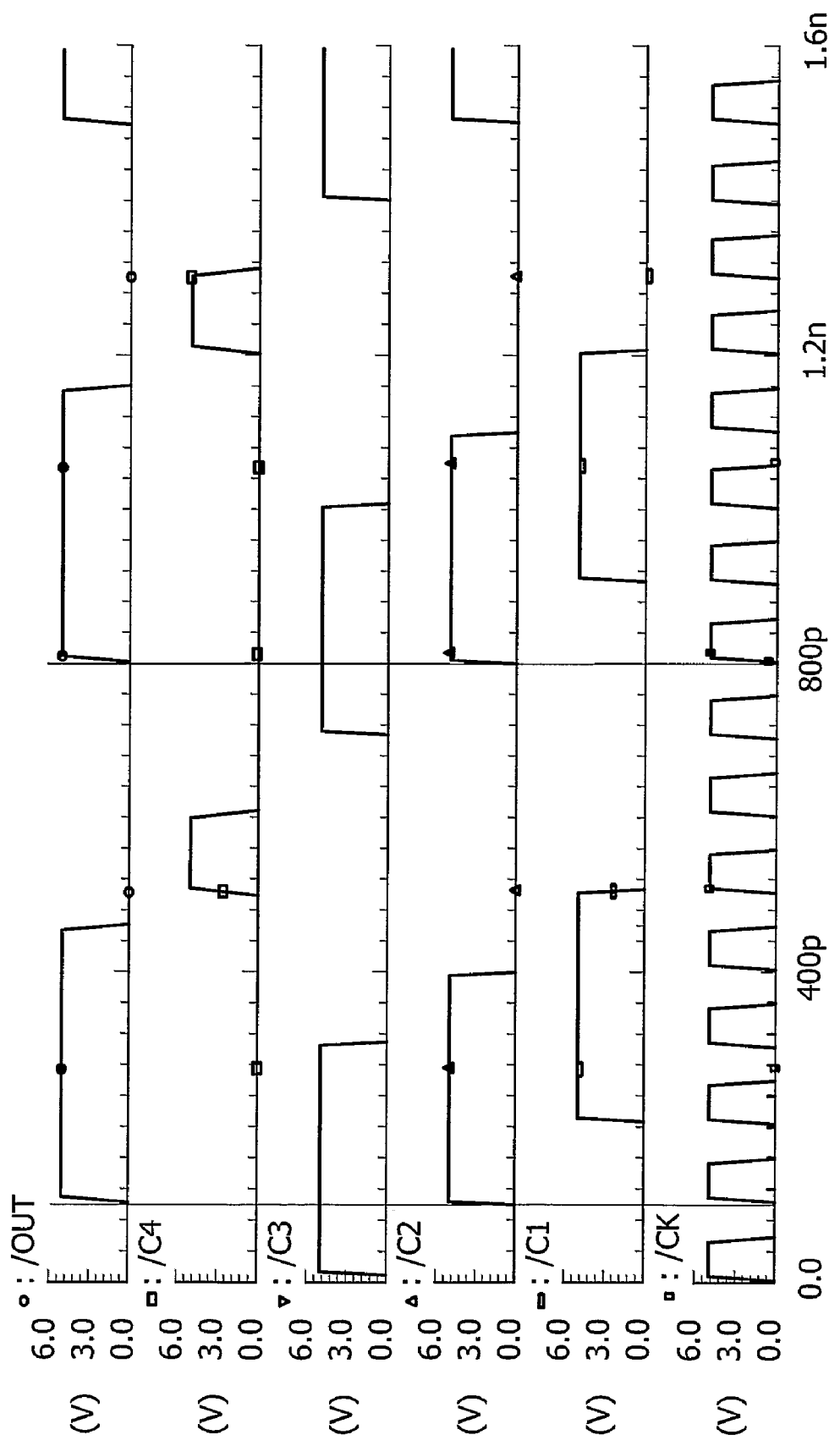
FIG. 7 depicts the waveforms of the signals of a divide by 7 circuit, according to an embodiment of the invention.

FIG. 6 depicts an implementation of a divide by 7 circuit, according to an embodiment of the invention. Flip-flops DFF1, DFF2 and DFF3 implement a divide by 6 Grey counter with DFF1 being the most significant flip-flop. DFF4 and the AND gate coupled to it implement end of count circuit. The rest of the components are the same as in the implementation of the divide by 5 circuit.

It is observed that independently of the division factor the output signal has the logical equation Ck*Q1+Q2. It is further observed that the implementation of the end of count circuit is not dependent on the division factor of the counter. Hence, a general design method for designing odd number frequency division circuits could be derived. Let us consider that the division factor is x=y+1, in which x is an odd number. The method should comprise steps of:

design and implement a divide by y counter,
  couple to the counter an end of count circuit as shown in FIG. 2,
  couple to the counter the output generation circuit, which corresponds to the equation Ck*Q1+Q2.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed processor. The invention resides in each new feature or combination of features.

The invention claimed is:

1. A frequency divider providing an odd integer division factor comprising:
  a binary counter composed of a single flip-flop for providing an division factor of three, the binary counter having a clock input for receiving a periodical clock signal having a frequency;
  an End Of Count circuit coupled to the binary counter for generating an End Of Count signal for a clock period after every even integer number periods of the clock signal the end of count signal being inputted to an input of the counter; and
  an output generator coupled to the binary counter and to the clock input that is substantially equal to the frequency of the frequency signal divided by the odd division factor.

2. The frequency divider of claim 1, wherein the output generator is a combinatorial logic circuit.

3. The frequency divider circuit of claim 1, wherein the end of count circuit comprises an AND gate for receiving two most significant bits generated by the binary counter and for providing a signal for changing a state of a flip-flop for a clock period.

4. The frequency divider circuit of claim 3, wherein the flip-flop is a D flip-flop.

5. The frequency divider circuit of claim 1, wherein the binary counter is composed of one D flip-flop.

6. The frequency divider of claim 1, wherein the output signal generated by the output generator has substantially a 50% duty cycle.

7. The frequency divider of claim 1, wherein the binary counter consists essentially of one flip-flop.

8. The frequency divider of claim 1, wherein the binary counter consists essentially of one D flip-flop.

9. A frequency divider providing an odd integer division factor comprising:

a binary counter comprising a Gray code counter for providing an odd division factor y using n flip-flops, where $n=y-1/2$ the binary counter having a clock input for receiving a periodical clock signal having a frequency;

an End Of Count circuit coupled to the binary counter for generating, an End Of Count signal for a clock period after every even integer number periods of the clock signal the end of count signal being inputted to an input of the counter; and an output generator coupled to the binary counter and to the clock input that is substantially equal to the frequency of the frequency signal divided by the odd division factor.

10. The frequency divider of claim 9, wherein the output generator is a combinational logic circuit.

11. The frequency divider of claim 9, wherein the end of circuit counter comprises an AND gate for receiving two most significant bits generated by the binary counter and for providing a signal for changing a state of a flip-flop for a clock period.

12. The frequency divider of claim 11, wherein the flip-flops are D flip-flops.

13. The frequency divider of claim 9, wherein the output signal generated by the output generator has substantially a 50% duty cycle.

* * * * *